United States Patent
Feiweier

(10) Patent No.: US 10,613,175 B2
(45) Date of Patent: Apr. 7, 2020

(54) METHOD AND APPARATUS TO CORRECT A SIGNAL PHASE IN THE ACQUISITION OF MAGNETIC RESONANCE SIGNALS

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 32 days.

(21) Appl. No.: 15/687,954

(22) Filed: Aug. 28, 2017

(65) Prior Publication Data
US 2018/0059199 A1     Mar. 1, 2018

(30) Foreign Application Priority Data
Aug. 29, 2016   (DE) .................. 10 2016 216 163

(51) Int. Cl.
| | | |
|---|---|---|
| *G01R 33/483* | (2006.01) | |
| *G01R 33/561* | (2006.01) | |
| *G01R 33/54* | (2006.01) | |
| *G01R 33/565* | (2006.01) | |

(52) U.S. Cl.
CPC ....... *G01R 33/4835* (2013.01); *G01R 33/543* (2013.01); *G01R 33/561* (2013.01); *G01R 33/56572* (2013.01); *G01R 33/5611* (2013.01)

(58) Field of Classification Search
CPC .......... G01R 33/4835; G01R 33/56572; G01R 33/288; G01R 33/543; G01R 33/56; G01R 33/561; G01R 33/5611; G01R 33/56563; G01R 33/56581
See application file for complete search history.

(56) References Cited

U.S. PATENT DOCUMENTS

| | | | |
|---|---|---|---|
| 4,760,336 A | 7/1988 | Conolly | |
| 10,120,050 B2 * | 11/2018 | Feiweier | ................ G01R 33/56 |
| 2013/0057280 A1 * | 3/2013 | Feiweier | ............ G01R 33/4835 |
| | | | 324/309 |
| 2013/0057281 A1 | 3/2013 | Feiweier | |
| 2013/0285656 A1 * | 10/2013 | Feiweier | ................ G01R 33/56 |
| | | | 324/309 |
| 2014/0210471 A1 * | 7/2014 | Stemmer | .......... G01R 33/56554 |
| | | | 324/309 |
| 2014/0253120 A1 * | 9/2014 | Ugurbil | .................. A61B 5/055 |
| | | | 324/309 |

* cited by examiner

*Primary Examiner* — Rishi R Patel
(74) *Attorney, Agent, or Firm* — Schiff Hardin LLP

(57) ABSTRACT

In a method and apparatus to correct a signal phase in the acquisition of magnetic resonance signals of an object to be examined in a slice multiplexing method, magnetic resonance signals from at least two different slices of the object are detected simultaneously. In at least one slice-selection time period, a slice-selection gradient is generated by a slice-selection-gradient pulse. During the activation of the slice-selection gradient in each case a radio-frequency pulse with a slice-specific frequency is emitted for each of the slices. The radio-frequency pulses for the different slices at least partially temporally overlap and are temporally offset for the phase correction, so the duration of the slice-selection time period is shortened by modification of the slice-selection gradients.

22 Claims, 6 Drawing Sheets

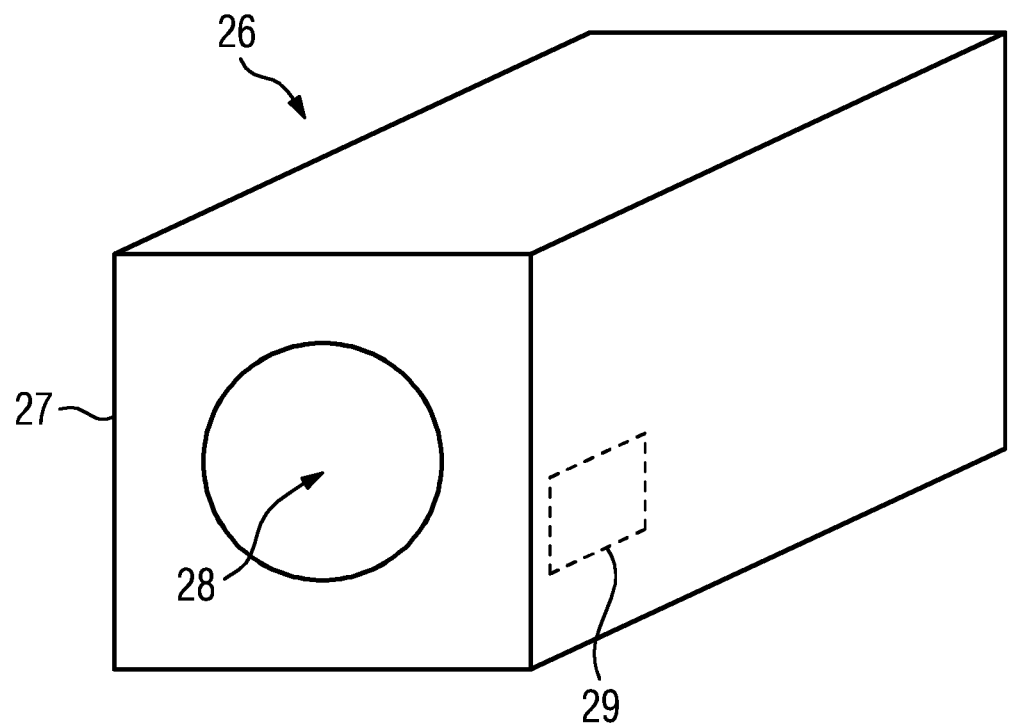

METHOD AND APPARATUS TO CORRECT A SIGNAL PHASE IN THE ACQUISITION OF MAGNETIC RESONANCE SIGNALS

BACKGROUND OF THE INVENTION

Field of the Invention

The invention relates to a method, a magnetic resonance apparatus, and a non-transitory, computer-readable data storage medium, to correct a signal phase in the acquisition of magnetic resonance signals of an object to be examined in a slice multiplexing method with which magnetic resonance signals from at least two different slices of the object to be examined are detected simultaneously,

Description of the Prior Art

In a method of the type described above, it is known from DE 2012 205 587 B4 to generate, in at least one slice-selection time period, a slice-selection gradient by activation of a slice-selection-gradient pulse, during which in each case a radio-frequency pulse with a slice-specific frequency is radiated for each of the slices, with the radio-frequency pulses for the different slices at least partially temporally overlapping. It is also known from DE 2012 205 587 B4 to apply a linear slice-specific correction phase, which is determined for each of the different slices. DE 2012 205 587 B4 also discloses determining, for each of the radio-frequency pulses from the correction phase and the properties of the slice-selection gradient, a temporal offset relative to a middle point in time of the slice-selection time period for at least one slice-selection time period, and to apply that offset such that a slice-specific correction-gradient moment in the slice-selection direction, which contributes to the achievement of the correction phase for the respective slice, acts on the magnetization of the respective slice.

Particularly in the field of medicine, magnetic resonance imaging has become a virtually indispensable imaging modality. One inherent problem with magnetic resonance imaging is that many acquisition processes require a long acquisition time. Therefore, in order to reduce acquisition times, research efforts are increasingly focused on methods for accelerating magnetic resonance raw data acquisition. One important class of these acceleration options is the simultaneous acquisition of magnetic resonance signals from different regions of the object to be examined, in particular different slices. Generally, such procedures can be characterized by, at least during a portion of the measurement, transverse magnetization of at least two slices being specifically used simultaneously for the imaging process. This is frequently called slice multiplexing or simultaneous multislice imaging (SMS—"simultaneous multislice"). This is in contrast to established multislice imaging with which the signal is acquired from at least two slices in alternation, i.e. completely independently of one another, with a correspondingly longer acquisition time. Examples of slice multiplexing methods include Hadamard coding, simultaneous echo refocusing ("simultaneous echo refocusing"—SER), broadband data acquisition or also parallel imaging in the slice direction. Details of these techniques and the associated references can be found in DE 10 2012 205 587 B4, for example.

One drawback of simultaneous multislice imaging (SMS) is that the application of slice-specific additional correction-gradient moments is only restrictedly possible. Such correction-gradient moments are, for example, necessary to reduce dephasing effects during diffusion or flow imaging or local signal voids in acquisition with T2* contrast, for example with gradient echo imaging.

It is suggested in DE 10 2011 082 009 B3 that radio-frequency pulses, which in SMS are usually temporally superimposed and act on the individual slices, be completely temporally separated from one another. This produces time intervals in which applied gradient pulses exert a different effect on the magnetization evolution of the two slices. For example, it is possible that, first, the first of two slices to be acquired is excited, then a number of gradient pulses that are only relevant for the magnetization of the first slice are applied and then the second slice is excited and then the transverse magnetization of both slices simultaneously is used for the imaging. The temporal separation of the radio-frequency pulses further has the advantage that it achieves a reduction in the specific absorption rate (SAR) and the necessary peak radio-frequency power. A disadvantage with this approach is that the temporal separation has a relatively long duration that significantly extends the echo time of at least one of the simultaneously excited slices resulting in a reduction in the signal-to-noise ratio. Moreover, the number of simultaneously excited slices have echo times that differ significantly from one another, and this can result in unwanted contrast differences.

DE 10 2012 205 587 B4, which is incorporated herein by reference, suggests that the radio-frequency pulses of the individual slice excitations be only partially separated from one another with a selective shift. This means temporal offsets are determined for the radio-frequency pulses of the different slices to be used within a slice-selection time period thus ensuring that the evolution of the magnetization in the slices to be simultaneously depicted is impressed with different correction-gradient moments along the direction of the slice axis (slice-selection direction). The temporal offsets there are selected such that a linear correction phase is achieved in the slices that compensates unwanted effects of other components of the magnetic resonance sequence, for example diffusion gradients. In other words, the correction-gradient moment serves as a means for dephasing correction by minimizing phase differences that are dependent upon the spatial position within a voxel and thus maximizing the composite signal.

In DE 10 2012 205 587 B4 as well, the (only partial) temporal separation of the radio-frequency pulses achieves a reduction in the SAR and the necessary peak radio-frequency power. A drawback of this approach is that the temporal shift of the radio-frequency pulses for the individual slices also causes a shift in the time point at which the k-space center is reached, i.e. an echo-time shift, so that each slice is subject to a different T2* or T2 relaxation.

A further disadvantage of both of these approaches is that, with the shift in individual radio-frequency pulses, the duration of the overall pulse is significantly longer thus resulting in additional restrictions in the choice of contrast parameters, in particular of the minimum adjustable echo time TE or the minimum repetition time TR.

SUMMARY OF THE INVENTION

An object of the invention is to reduce the duration of the slice-selection time periods with which temporal offsets are applied, and in particular to reduce or eliminate the echo shift between the different slices.

This object is achieved according to the invention by a method of the type initially described, wherein, (a) in at least one edge region of the slice-selection time period, which it would be necessary to add symmetry to both sides to an intended slice-selection time period with simultaneously emitted radio-frequency pulses due to the temporal offsets, a higher gradient strength of the slice-selection-gradient pulse than at the middle point in time of the slice-selection time period is selected. Also in the inventive method, the radio-frequency pulses are adjusted taking into account the gradient-strength curve for the slice-selection-gradient pulse and a prespecified slice profile.

This object also is achieved in accordance with the invention by a method of the type initially described wherein (b) at least one common component of an additional gradient moment of the correction-gradient moment, which contributes to the achievement of the correction phase for the slices to be jointly measured, is generated in an additional gradient pulse in the slice-selection direction acting on all the slices to be jointly measured, so that the temporal offsets that are determined taking account of the component and are to be applied enable a shorter slice-selection time period than without an additional gradient pulse.

In general terms, therefore, in the method according to the invention the gradient pulses along the slice-selection direction are modified and/or supplemented such that the time required for the application of the additional correction-gradient moments is as short as possible. The technique described in DE 10 2012 205 587 B4 is expanded and optimized by optimizing the course of the slice gradient. As will be described in more detail below, in case (a), substantially the VERSE technique is used to shorten the time intervals required to shift the individual radio-frequency pulses. In case (b), a generally applicable correction-gradient moment is separated as an additional gradient moment in order to reduce the maximum number of slice-specific correction-gradient moments to be achieved. Both these specific embodiments can be used individually, but they are preferably combined with one another.

It should also be noted that, ideally, the offsets, and optionally further correction-gradient moments, which will be addressed in more detail in the following, achieve the linear correction phase for at least one slice, preferably all slices, which means that a slice-specific correction-gradient moment in the slice-selection direction, which, at least when supplemented by a further correction-gradient moment for at least one of the slices, preferably all the slices, corresponds to the respective correction phase, acts on the magnetization of the respective slice.

The embodiment (a) is based on the knowledge that the use of a higher amplitude of the slice-selection gradient in principle permits a reduction in the overall duration of the slice-selection time period. However, particularly in the case of only a small temporal shift of the radio-frequency pulses, this is accompanied by a significant increase in the specific absorption rate (SAR) and the necessary peak radio-frequency power. According to the invention, therefore, at least in the edge region, a higher amplitude, i.e. gradient strength, of the slice-selection-gradient pulse is selected, similarly to the procedure with the so-called VERSE technique with standard radio-frequency pulses (variable rate selective excitation, see U.S. Pat. No. 4,760,336). In the simplest case, the gradient strength of the slice-selection-gradient pulse is increased only in the edge region as described above, which can be designated the shift region, of the slice-selection time period. Therefore, the edge region or shift region is the region that has to be added to the duration of the slice-selection-gradient pulse due to the shift (due to the temporal offsets). As long as it can be brought into conformity with the SAR and the peak radio-frequency power, this procedure can be extended beyond the edge region, so that, despite the shorter slice-selection time period, this enables the same slice-specific correction-gradient moments to be achieved. Here, in order to retain the desired slice profile, it is obviously necessary to adjust the radio-frequency pulses as is in principle known from the VERSE technique.

In accordance with the invention, it is expediently possible to continue the increase in gradient strength from the edge region at least into an additional region of the slice-selection time period in which not all radio-frequency signals are applied, in particular at the most only one of the radio-frequency signals is applied. The increase in the gradient strength in the edge region has already ensured, for all repetitions/individual echoes, that a compression by the higher gradient strength takes place only in the edge region in which not all the radio-frequency pulses, for example only one radio-frequency pulse, can be present. This means the increase in the specific absorption rate is minimal and the necessary peak radio-frequency power is unchanged. If it can be ensured that not all the radio-frequency pulses, in particular only one radio-frequency pulse, are radiated in additional regions as well, the region of increased gradient strength can be extended correspondingly without requiring too much additional SAR and further necessary peak radio-frequency power.

Herein, the adjustment of the pulse shape of the slice-selection-gradient pulse is changed in conformity with limitations due to hardware and stimulations, as is in principle known, so the gradient strength is reduced by a ramp toward the middle point in time.

Within the general context, it should again be noted that conventional acquisition processes consist of a number of successive echoes, i.e. successive repetitions, which in each case have their own excitation pulses. Herein, it may be the case that different correction phases are necessary within different repetitions, wherein, however, it is desirable for the slice-selection time periods to be selected as identical at least for radio-frequency pulses with the same effect in the sequence. Therefore, it is usually the case that, for all slice-selection time periods of the acquisition process in which temporal offsets are to be applied, the duration of the slice-selection time period is selected as fixed in dependence on the maximum temporal offset determined for all these slice-selection time periods. Therefore, the duration of the slice-selection time period that is selected is the duration that doubles the maximum possible temporal offset, plus the duration of the thus-offset radio-frequency pulse after the temporally offset center thereof. It is precisely in a procedure of this kind that variant b) is extremely useful.

Generally speaking, the temporal offset during the slice-selection time period causes the simultaneously affected slices to be impressed with a correction-gradient moment with a different polarity and amount in each case. In the example of two slices, this can be determined for the first slice as $M1 = +F\, G_S\, \Delta T_1$, for the second slice as $M2 = +F\, G_S\, \Delta T_2$. If, for example, the necessary extension of the slice-selection time period is obtained from the maximum correction-gradient moment to be applied and if, as is usual, the edge region that forms at both sides of the slice-selection time period is selected as symmetrical in order to be able to take account of varying correction-gradient moments of the simultaneously excited slices during a measurement, it is clear that the edge region is not fully utilized not for all repetitions. This means it is possible for the slice-selection-gradient pulse to be applied without the simultaneous emission of a radio-frequency pulse.

The inventive variant b) is based on the concept of applying an additional correction-gradient moment, the additional gradient moment, which is to be applicable for all simultaneously excited slices, outside the slice-selection time period by an additional gradient pulse in the slice-selection direction. The remaining slice-specific correction-gradient moments, which are in particular necessary for the complete achievement of the correction phase, are then again achieved via temporal offsets of the radio-frequency pulses, wherein, however, the maximal necessary shift, i.e. the maximum temporal offset necessary will be smaller so that the duration of the edge regions, and hence the duration of the slice-selection time period, can be reduced.

To this end, ideally, the additional gradient moment should be selected such that it either actually makes a useful contribution to the two desired correction phases, or increases the at least one shorter temporal offset to a lesser degree than it decreases the maximum temporal offset.

In this context, in a further embodiment, for intended temporal offsets determined based on a non-use of the additional gradient pulse, a mean value of the correction-gradient moments formed during the use of the intended offsets for the slices is determined, and the additional moment corresponding to the mean value is selected. In this case, therefore, first a mean correction-gradient moment, for all slices to be excited simultaneously is determined. This mean correction-gradient moment is then applied as an additional gradient moment outside the slice-selection time period to all slices simultaneously. With respect to the above formulas, this produces, in the example of two slices, $M_S$=F (M1+M2)/2. As is generally known, F is the factor describing the mode of operation of the radio-frequency pulse. In the case of an excitation pulse as a radio-frequency pulse, the factor is F=1, with a symmetrical refocusing pulse, F=2 and, in the case of a storage or restoration pulse (for stimulated echoes), F=1. The temporal shift of a symmetrical refocusing pulse results in a shortened duration of action of the slice-selection gradient on one side and simultaneously an extended duration of action on the other side: i.e. the correction moment is doubled, as represented by F=2. During the excitation, storage or restoration, only the duration of action in each case on one side of the temporally shifted radio-frequency pulse is relevant, as represented by F=1.

While, in principle, the additional gradient pulse can be activated at any time points at which it is able to act on all slices, in an embodiment of the present invention the additional gradient pulse is activated jointly with a gradient pulse responsible for the desired correction phase, in particular a diffusion-gradient pulse. In this way, it is possible for the magnetic resonance sequence used during a repetition to be kept compact. The gradient pulses that necessitate the correction phase, for example diffusion gradient pulses, are simply modified appropriately by the additional gradient pulse.

In another embodiment of the present invention, a higher gradient strength of the slice-selection-gradient pulse than at the middle point in time of the slice-selection time period is also used for slice-selection time periods in which no temporal offsets are applied. This means that the described application of the VERSE technique is expediently also possible and expedient with slice-selection time periods in which no temporal offsets are applied in order further to reduce the pulse duration without a significant increase in the specific absorption rate and/or necessary peak radio-frequency power.

Within the context of the present invention, it may also be the case that the possibilities for achieving temporal offsets are limited, such as desired (minimum) echo times, repetition times and/or echo shifts being limited by the temporal offsets. Therefore, in a preferred embodiment of the present invention, in the case of a prespecified, not-to-be-exceeded limit value for the repetition time and/or the echo shift between the slices during the acquisition process, and when the restricted temporal offsets and/or additional gradient moments for maintaining the limit values are not sufficient to achieve the correction phases for all slices, a maximum possible correction-gradient moment is applied for the slices and/or a suitable selection of the additional gradient moment is used to select at least one slice for which the correction phase is achieved. Therefore, if the maximum possible duration of the shift-time interval is not sufficient to achieve the desired correction-gradient moment for a number of the simultaneously excited slices, it is at least possible to apply the maximum possible correction-gradient moment. It is particularly advantageous with respect to the embodiment b) of the present invention that this enables the selection of at least one slice for which the correction phase is to be achieved, i.e. an overall correction-gradient moment corresponding to the correction phase can be introduced. For this purpose, it is not the arithmetic mean that is selected for the additional correction moment, but a dedicated additional correction moment, which is introduced in the form of the additional gradient pulse as a correction-gradient moment for all simultaneously excited slices. A suitable selection ensures that the remaining temporal offsets of the at least one slice are possible in the duration of the slice-selection time period. Herein, it is particularly preferable for the at least one slice to be selected as a slice located in the center of the acquisition region of the object to be examined and/or covering a diagnostically relevant region. This enables, for example, the slices closest to the center of the acquisition region, which are most important for the diagnosis, to achieve the desired correction phase in full, which is accompanied by a corresponding increase in image quality.

In principle it is advantageous for the generation of the slice-specific correction-gradient moment to be distributed over a number of slice-selection time periods of an echo (a repetition), in particular using at least partially identical temporal offsets. For example, the slice-specific correction-gradient moment can be introduced distributed in equal parts to all radio-frequency pulses, in particular excitation and refocusing pulses. Herein, it is also possible to take account of the above-discussed factor F. The distribution of the slice-specific correction-gradient moment enables the maximum temporal offset per slice-selection time period to be reduced. Herein, it is particularly preferable for the distribution of the generation of the slice-specific correction-gradient moment over the plurality of slice-selection time periods to be determined in the context of an optimization method that minimizes the duration of the slice-selection time periods with temporal offsets to be applied. This means an optimum is determined, which permits the shortest possible slice-selection time periods and hence the shortest possible repetition times/quickest possible echo times.

The above-described embodiments of the present invention shorten the slice-selection time period, in particular the time period in which temporal offsets are to be applied, but do not change anything relating to the different magnetization evolutions of the simultaneously excited slices. The use of temporal offsets of the radio-frequency pulses, specifically the radio-frequency pulse shapes, for achieving the slice-specific correction-gradient moments, are accompanied by a shift in the time points at which the center of k-space in the read-out period is reached, which means that the echo times shift toward one another (echo shift). This results in a different T2* or T2 relaxation that is expressed in different contrasts of the magnetic resonance signals for the different, simultaneously excited slices. In the aforementioned DE 10 2011 082 009 B3, it was suggested in this respect that a skillful selection of the temporal sequence of radio-frequency pulses enables the spin-echo condition in the simultaneously excited slices to be fulfilled, and thus the differences in the T2* relaxation can be minimized. However, disadvantageously, the echo times of the slices still deviate from one another so that the different T2 relaxation can cause different contrasts to occur.

Therefore, a further embodiment of the present invention has been developed, which is also useful independently of the application of the VERSE technique or the additional gradient pulse. In this embodiment, in the case of at least two refocusing pulses to be applied as radio-frequency pulses during an echo (i.e. a repetition) in successive slice-selection time periods (in particular in the case of a preceding excitation pulse as a radio-frequency pulse), no temporal offsets are applied. Also, the slice-selection-gradient pulse that occurs during at least one of the at least two slice-selection time periods with which temporal offsets are used is applied with the opposite mathematical sign during at the least one other slice-selection time period in which temporal offsets are applied. The temporal offsets are determined taking into account the sign of the slice-selection-gradient pulses in order to achieve the correction phase to the greatest degree possible. Herein, two refocusing pulses should follow one another, usually with a spacing of half the echo time, i.e. TE/2, so that, in a preferred embodiment of the present invention, the temporal offsets for all slice-selection time periods, in which temporal offsets are to be applied, are selected to be identical. In this way the spacing of the individual refocusing pulses is kept as the half echo time, so that the spin-echo condition is fulfilled.

Therefore, in this way, it is possible with at least two refocusing pulses explicitly to avoid a temporal offset and hence the shift of the excitation pulses, so that the same echo time is retained and the slice-specific correction-gradient moments can be introduced in the slice-selection time periods of the refocusing pulses. This is based on the following consideration. The spin-echo condition at an echo time TE is then fulfilled precisely when the temporal spacing between the two refocusing pulses is TE/2. This means that the two radio-frequency pulses can be shifted within certain limits without any change in the influence of T2* or T2 relaxation on the contrast. However, the shift alone cannot be used to generate a slice-specific correction-gradient moment since the correction-gradient moment generated with the first refocusing pulse can be undone again with the following refocusing pulse. To achieve a slice-specific correction-gradient moment different from zero, it could be provided that, in the second refocusing pulse, the shifts of the pulse shapes assigned to the two slices are applied in the opposite direction, although in this case the spin-echo condition is no longer met for at least one of the slices at TE, which could result in a discrepant T2* contrast. However, as in this embodiment, if slice-selection gradients with different amplitudes or polarities are applied for the two refocusing pulses, a slice-specific correction-gradient moment different from zero remains. It is advantageous for the same amplitude, i.e. gradient strength, to be applied with the reverse polarity, i.e. the reverse sign, so that the slice-specific correction-gradient moments generated with each refocusing pulse are advantageously added together. In this way, it is possible, despite excitation pulses of the simultaneously excited slices that are not temporally shifted toward one another, to achieve slice-specific correction-gradient moments.

This significantly reduces, and ideally completely eliminates, the contrast variations between the simultaneously excited slices. Overall, it is then possible for dephasings induced in diffusion imaging with double-refocused spin echoes, for example, by Maxwell field terms, to be at least reduced, which for example significantly increases the precision of derived parameters, for example diffusion coefficients, anisotropy parameters and the like.

It is also noted that preferably, but not mandatorily, no temporal offsets are used in the case of a preceding radio-frequency pulse as an excitation pulse. If this is the case, it is possible for the T2/T2* contrast to be unchanged. However, even with a temporal offset with the excitation pulse, the different slice-selection gradients of the refocusing pulses can achieve a significantly reduced variation of the T2/T2* contrast compared with the same slice-selection-gradient pulses. It is possible, for example, for a temporal offset in the excitation pulses to correct a first effect, for example a dephasing effect due to Maxwell field terms of the readout gradients, while offsets in the refocusing pulses correct a second dephasing effect, for example due to Maxwell terms of the diffusion gradients.

As mentioned, the procedure described herein is also generally applicable without adjustments with respect to the slice-selection time period being necessary. This therefore provides another version of a method to correct a signal phase in the acquisition of magnetic resonance signals of an object to be examined in a slice multiplexing method with which magnetic resonance signals from at least two different slices of the object to be examined are detected simultaneously, wherein, in at least one slice-selection time period, a slice-selection gradient is generated by activation of a slice-selection-gradient pulse, during which in each case a radio-frequency pulse with a slice-specific frequency is emitted for each of the slices and the radio-frequency pulses for the different slices at least partially temporally overlap, wherein a linear slice-specific correction phase to be applied is determined for each of the different slices and for each of the radio-frequency pulses from the correction and the properties of the slice-selection gradient, a temporal offset relative to a middle point in time of the slice-selection time period is determined and applied such that a slice-specific correction-gradient moment in the slice-selection direction that contributes to the achievement of the correction phase for the respective phase acts on the magnetization of the respective slice. In this further version, in the case of at least two refocusing pulses to be applied as radio-frequency pulses during an echo in successive slice-selection time periods, wherein with a preceding excitation pulse as a radio-frequency pulse no temporal offsets are applied, the slice-selection-gradient pulse that occurs during at least one of the at least two slice-selection time periods with which temporal offsets are used is applied with the opposite sign and/or a changed gradient strength at the at least one other slice-selection time period in which temporal offsets are applied. Additionally the temporal offsets are determined taking into account the preceding sign of the slice-selection-gradient pulses in order to achieve the correction phase to the greatest degree possible. All of the versions relating to the other embodiments apply analogously to this embodiment.

All of the embodiments described above can be combined in many ways with one another. Hence, the method according to the invention permits the application of slice-specific correction-gradient moments in SMS imaging in a shorter time and with reduced contrast variations between the simultaneously excited slices. Compared to the methods known at present, for clinical diffusion measurements on the head, the method according to the invention can achieve a reduction in the minimum possible echo time of approximately 10 ms resulting directly in a significant increase in the signal-to-noise ratio.

It is also noted at this point that, in one embodiment that is not according the invention, alternatively to a temporal shift of the radio-frequency pulses of the individual slice excitations, it is also conceivable for the pulse shapes of the actual radio-frequency pulses to be manipulated. For example, it is conceivable for the center of symmetry of individual radio-frequency pulse shapes to be shifted such that the desired slice-specific correction-gradient moment is achieved.

In addition to the method according to the invention, the present invention concerns a magnetic resonance apparatus having a control computer designed to implement the method according to the invention. All embodiments of the method according to the invention can be applied analogously to the magnetic resonance apparatus according to the invention so that it is also able to achieve the above-described advantages.

The present invention also encompasses a non-transitory, computer-readable data storage medium encoded with programming instructions that, when the storage medium is loaded into a control computer or computer system of a magnetic resonance apparatus, cause the control computer or computer system to operate the magnetic resonance apparatus so as to implement any or all embodiments of the method according to the invention, as described above.

The data medium is preferably a non-transient data medium, for example a CD-ROM.

BRIEF DESCRIPTION OF THE DRAWINGS

FIG. 6 shows a magnetic resonance facility according to the invention.

DESCRIPTION OF THE PREFERRED EMBODIMENTS

The exemplary embodiments described in the following are based on the method described in DE 10 2012 205 587 A1 and so this will not be described in any more detail herein. In that know SMS imaging technique, for at least one slice-selection time period, in which in each case a radio-frequency pulse is to be applied for the slices to be simultaneously excited, the radio-frequency pulse shapes of the radio-frequency pulses are time-shifted toward one another> This causes the duration of the slice-selection-gradient pulse, as well as the slice-selection time period, to be extended. There are a number of repetitions or echoes in which it is quite possible for different correction phases, and hence slice-specific correction-gradient moments, to be necessary in order to achieve these correction phases, so that it is also possible for different temporal offsets to result. Usually the duration of the slice-selection time period in which the temporal offsets are to be applied is determined symmetrically with reference to the maximum temporal offset, so that this maximum temporal offset is also possible within the slice-selection time period. In the case of a number of echo trains, the offset is selected to be identical for all of them.

Figure 1:
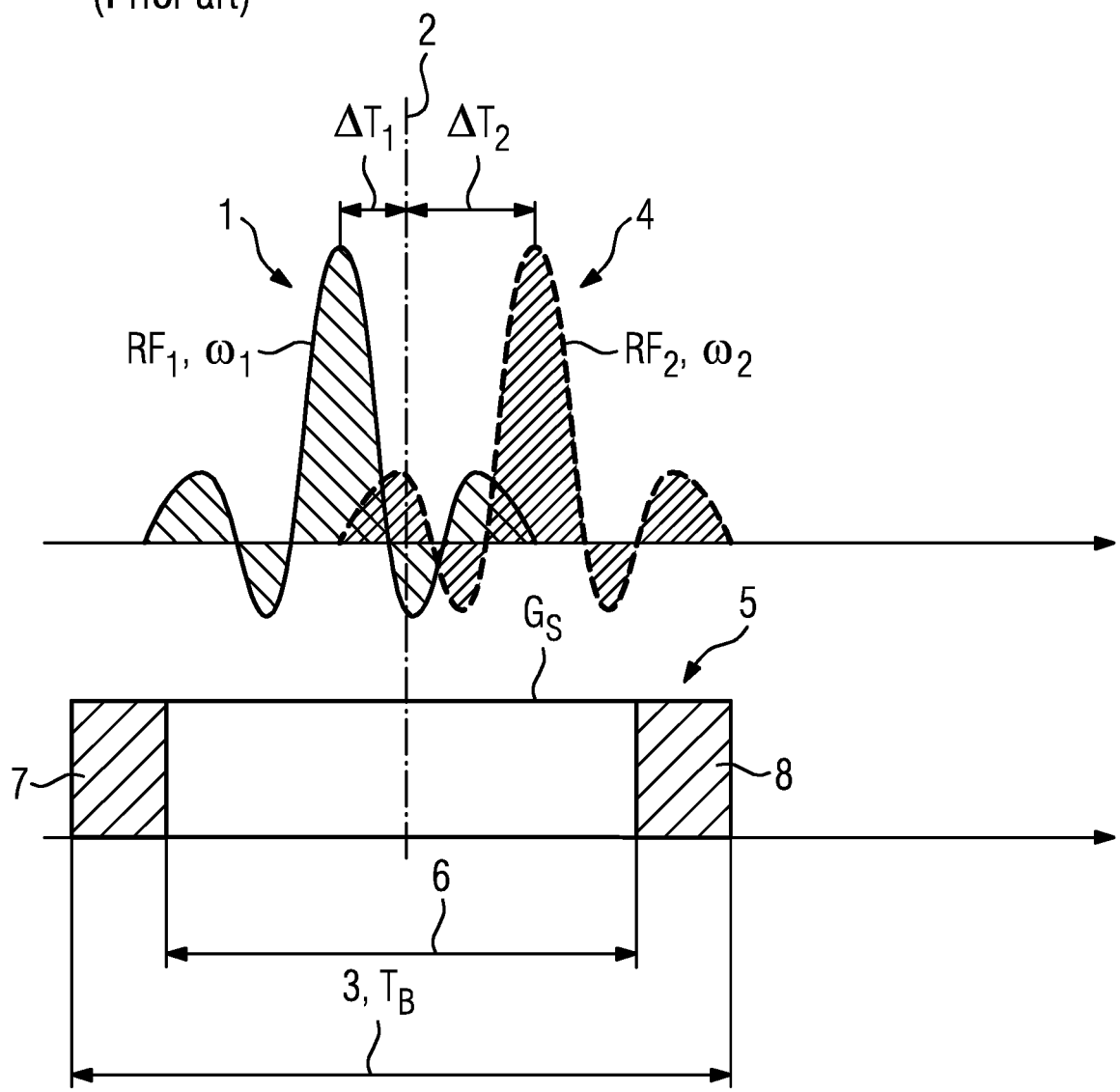
FIG. 1 shows a shift of radio-frequency pulses toward one another according to the prior art.

FIG. 1 shows the procedure according to DE 10 2012 205 587 B4 in more detail, wherein the following examples are all shown for two slices to be excited simultaneously. The concept applies correspondingly to a larger number of slices to be excited simultaneously.

According to FIG. 1, a radio-frequency pulse 1 for the first slice is shifted, with respect to the middle point in time 2 of the slice-selection time period 3 with the duration $T_B$, by the temporal offset $\Delta T_1$. Correspondingly, a radio-frequency pulse 4 for the second slice (or the pulse shape thereof) is shifted with respect to the middle point in time 2 by a temporal offset $\Delta T_2$. Also shown is the slice-selection-gradient pulse 5 with the gradient amplitude $G_S$ that extends over the slice-selection time period. The temporal shift of the radio-frequency pulses 1, 4 from the middle point in time 2 causes the first slice to be impressed (superimposed) with an additional moment $M_1 = +F\, G_S\, \Delta T_1$ and the second slice to be impressed with a slice-specific correction-gradient moment $M_2 = -F\, G_S\, \Delta T_2$. As explained in the earlier description, the factor F adopts different values depending on the mode of operation of the radio-frequency pulse.

However, at the same time, it can be seen from FIG. 1 that the duration of the slice-selection time period 3 is made longer. Specifically, it is extended, compared to a duration 6 corresponding to the temporal length of the pulse shapes of the radio-frequency pulses 1, 4, by edge regions 7, 8, which, as described, result from the maximum temporal offset to be applied. For illustrative purposes, the present case relates to the temporal offset $\Delta T_2$, since, as can be seen, the edge region 8 is completely utilized at this side. Reference is made to the fact that this also increases the size of a rephasing moment to be applied, which is not shown in more detail, for clarity. It is also the case that, when the radio-frequency pulses 1, 4 are excitation pulses, the following magnetization evolutions of the two simultaneously excited slices are subject to a different T2* or T2 relaxation and, to be precise, by the total of the temporal offsets, i.e. $\Delta T_1 + \Delta T_2$. The mutually combinable variants of the method according to the invention described in the following are used either to shorten the duration of the slice-selection time period 3, in order, for example, to enable shorter echo times and/or to reduce the repetition time overall, or to reduce the different relaxations to the greatest degree possible in order to obtain the same contrasts from the simultaneously excited slices.

Figure 2:
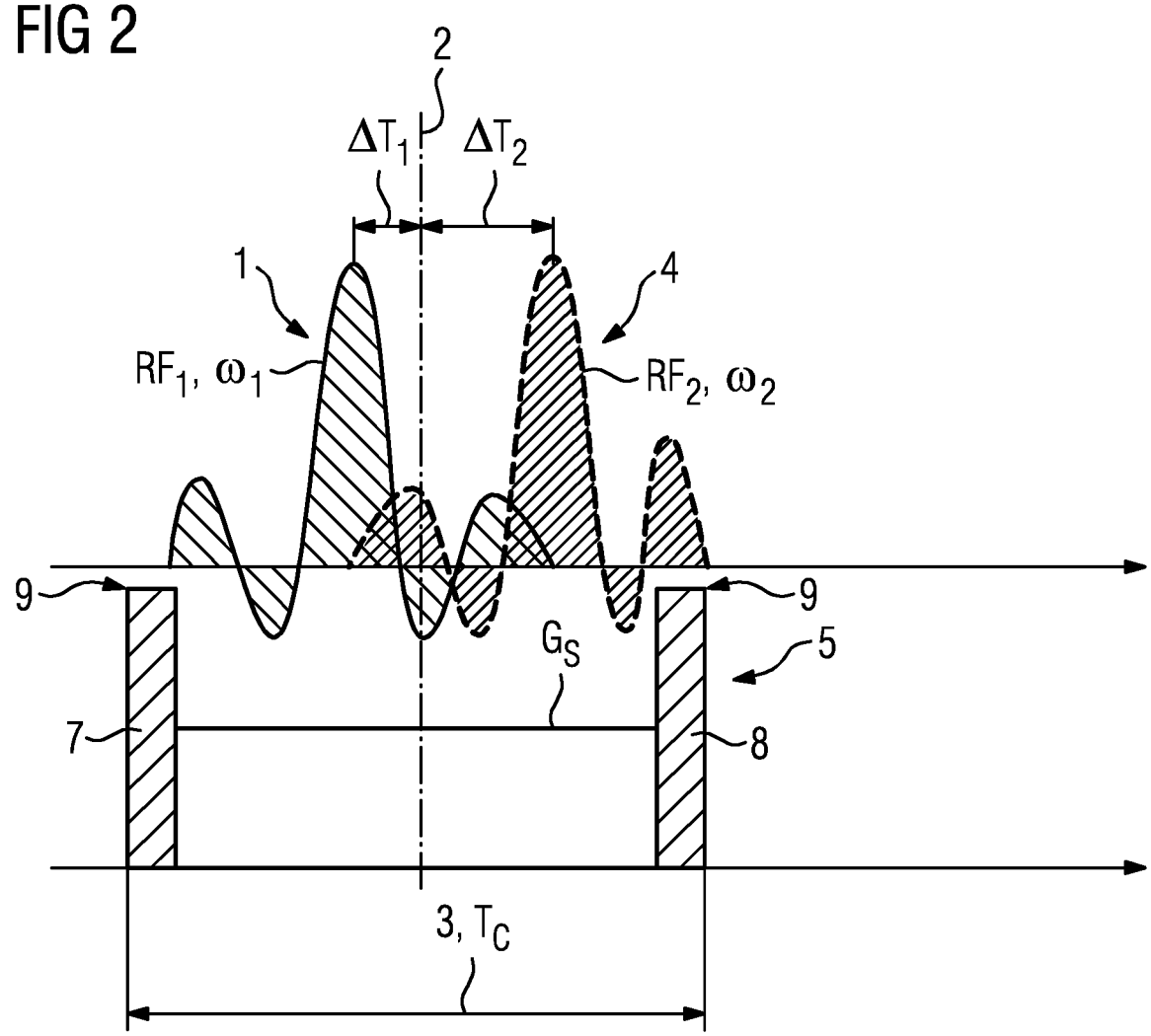
FIG. 2 shows an embodiment of the invention with increased gradient strength of the slice-selection-gradient pulse in edge regions.

FIG. 2 shows a first measure that can be accomplished by the method according to the invention for shortening the slice-selection time period 3 (discussed in the general description as a)). Herein, the underlying idea is the knowledge that the use of a higher amplitude $G_S$ of the slice-selection-gradient pulse in principle permits a reduction in the overall duration, but accompanied—in particular in the case of only a small temporal shift of the radio-frequency pulses 1, 4—by a significant increase in the specific absorption rate and the necessary peak radio-frequency power.

Therefore, the overall amplitude of the slice-selection-gradient pulse 5 is not increased, but a higher amplitude of the slice-selection gradient occurs only in a part of the slice-selection gradient pulse 5, in particular in the edge regions 7, 8. This is similar to the process in the VERSE technique with standard radio-frequency pulses.

This is evident in FIG. 2, in which, for simplicity, the same reference numbers are used for the same objects in the slice-selection time period 3. It is evident that a higher amplitude 9 of the slice-selection-gradient pulse 5 was selected in the edge regions 7, 8 of the slice-selection time period 3 thus resulting in a simple case. It will be apparent that FIG. 2 is a simplified depiction, because in fact the amplitude of the slice-selection-gradient pulse 5 is switched, not as an abrupt jump, but in a continuous ramp in conformity with hardware (amplifier) limitations and to comply with legal requirements that limit RF emission that a patient can receive. It is apparent that the course of the radio-frequency pulses 1, 4 should be adjusted appropriately to obtain the desired effect. This is known from the VERSE technique.

Despite a shorter slice-selection time period 3 ($T_C$ is smaller than $T_B$), the technique depicted in FIG. 2 enables the same slice-specific correction-gradient moments to be achieved. Since, with the VERSE technique, the radio-frequency pulses 1, 4 are only compressed in the edge region 7, 8, the increase in the specific absorption rate (SAR) is minimal and the necessary peak radio-frequency power does not change.

Figure 3:
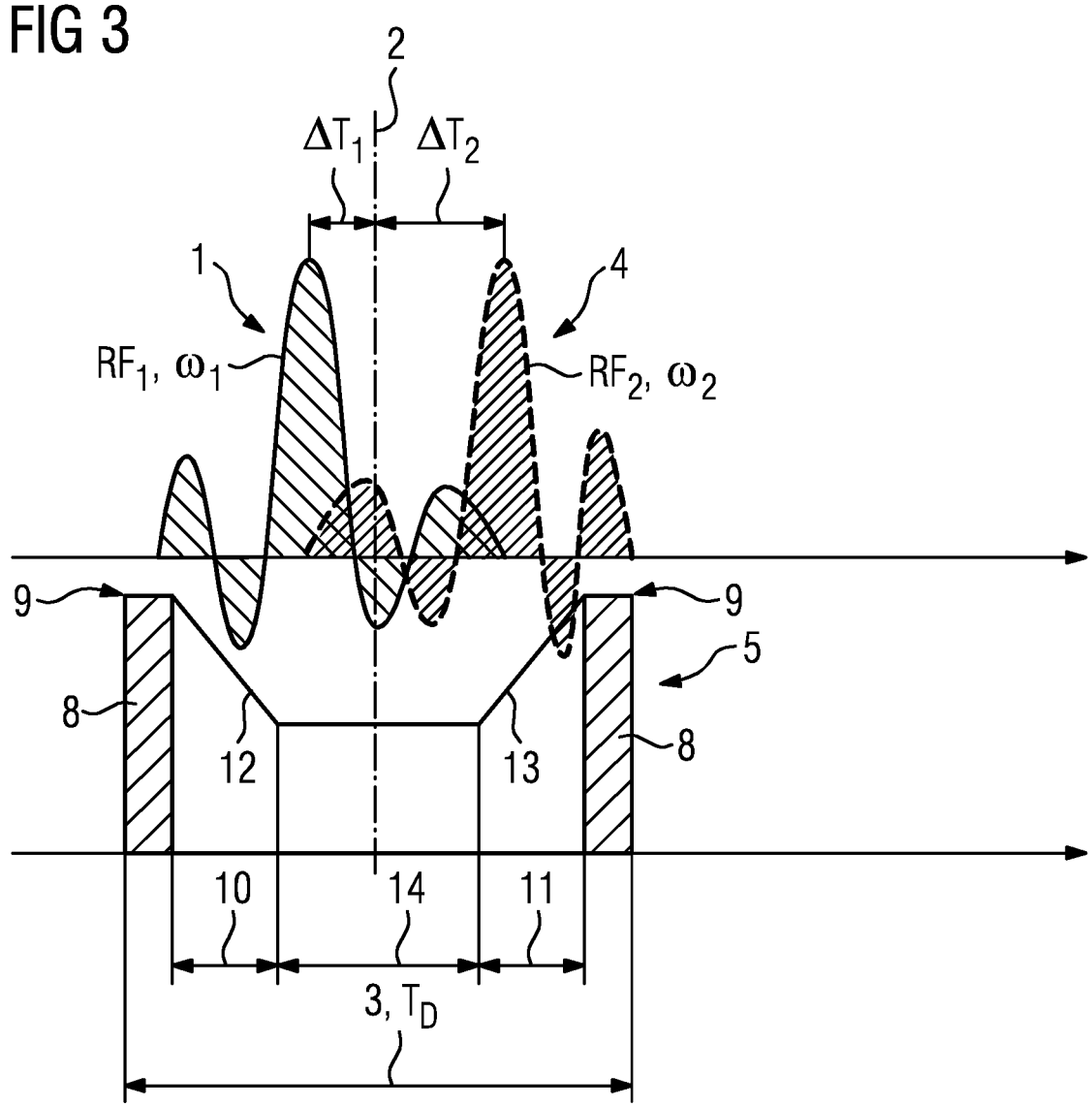
FIG. 3 shows a further embodiment compared to FIG. 2.

FIG. 3 shows an extension of this modification of the slice-selection-gradient pulse 5 with which the amplitude of the slice-selection-gradient pulse 5 is increased not only in the edge regions 7, 8, but also in additional regions 10, 11 in which substantially only a single one of the radio-frequency pulses 1, 4 is present. In the additional regions 10, 11, as indicated by the lines 12, 13, the amplitude falls linearly from the value 9 to a lower standard value lying within a middle region 14 of the slice-selection time period 3. This further reduces the duration of the slice-selection time period 3 ($T_D$ is smaller than $T_C$).

Figure 4:
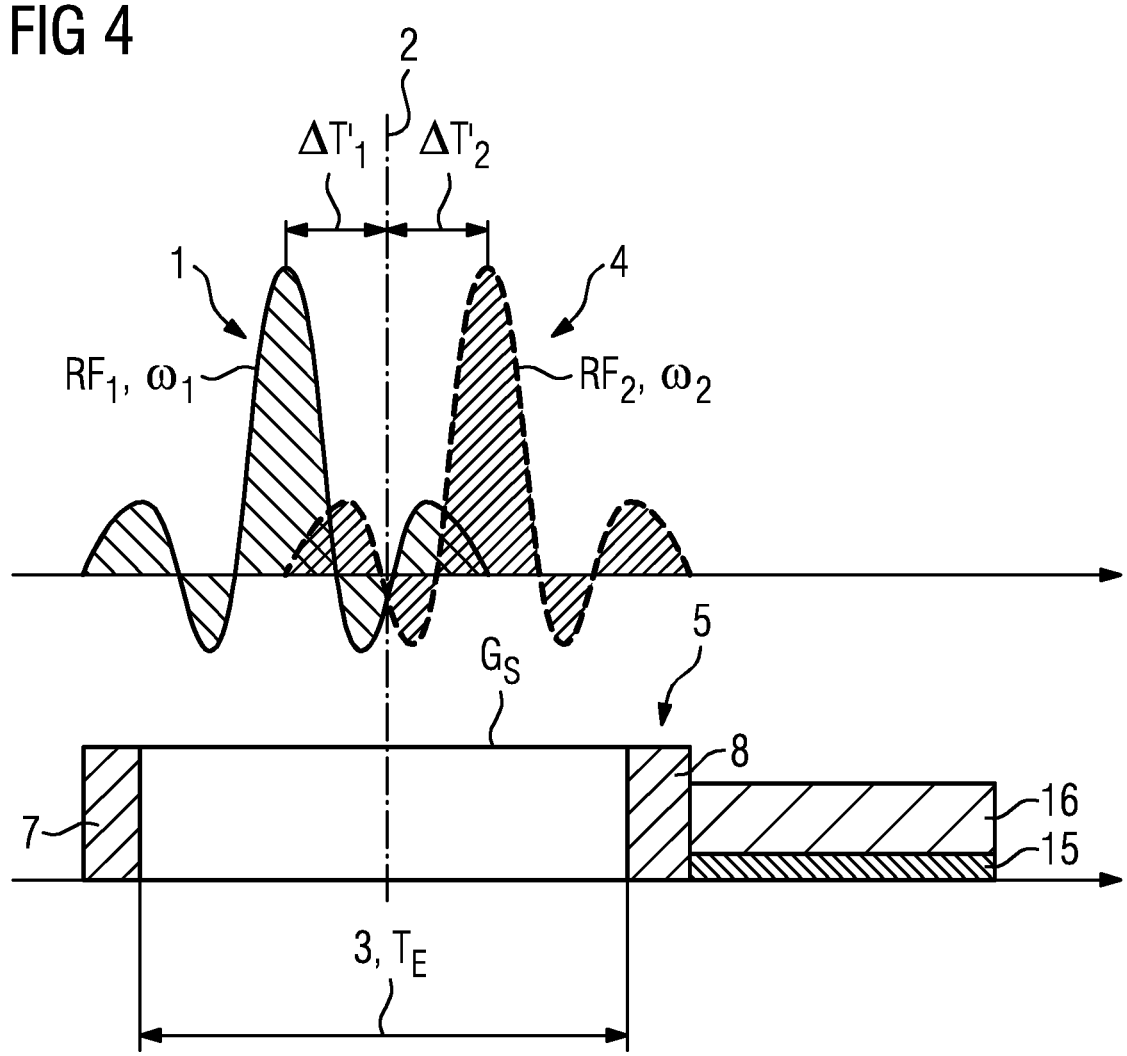
FIG. 4 shows an embodiment using an additional gradient pulse in the slice-selection direction.

FIG. 4 explains the further variant (b) that can be applied in the method according to the invention to reduce the slice-selection time period 3. In this variant, first a mean correction moment is determined as an additional gradient moment of the correction-gradient moment for all slices to be simultaneously excited. Specifically, this means that, for intended temporal offsets determined based on a non-use of an additional gradient pulse, a mean value of the correction-gradient moments formed during the use of the intended offsets for the slices is determined, wherein the additional gradient moment corresponding to the mean value is selected. For the example in FIG. 1, this means that the mean value is obtained as $M_S = F(M_1 + M_2)/2$. The additional gradient moment determined in this way corresponds to a component that contributes to the overall correction-gradient moment for both slices so that it is introduced in an additional gradient pulse 15 acting on all slices to be excited, see FIG. 4, which is activated jointly with a gradient pulse responsible for the desired correction phase, here a diffusion-gradient pulse 16. The remaining slice-specific correction-gradient moments are then again achieved by offsets of the radio-frequency pulses 1, 4. However, the maximal necessary offset is now as a rule smaller so that the duration of the edge regions 7, 8, and hence the duration of the slice-selection time period 3, can be shortened ($T_E$ is smaller than $T_B$). The change in the offsets is depicted by the dashed lines for the offset times that are also depicted.

It is also noted that the two possibilities for shortening the duration of the slice-selection time period 3 can be applied in combination. It should also be noted that, at least as far as the VERSE technique is concerned, this can be used further to reduce the overall duration of an echo chain including during the output of radio-frequency pulses, with which no temporal offsets are applied.

Although the measures of the method according to the invention described thus far do reduce the slice-selection time period 3, at first there is no change to the different magnetization evolution of simultaneously excited slices. The temporal offsets of the radio-frequency pulses 1, 4 for achieving the slice-specific correction-gradient moments are accompanied by a discrepant influence of the T2* or T2 relaxation. This can result in different contrasts in the slices. The third measure of the method according to the invention which is now explained in more detail by FIG. 5 enables the minimization, ideally elimination of the T2* and T2 contrast differences in the simultaneously excited slices with the simultaneous achievement of the slice-specific correction-gradient moments. The only precondition is at least two refocusing pulses, as is the case, for example, in double-refocused diffusion imaging. For simplicity, the depiction in FIG. 5 relates to precisely two refocusing pulses, but the measure can be applied in a correspondingly generalized way with more than two refocusing pulses.

Figure 5:
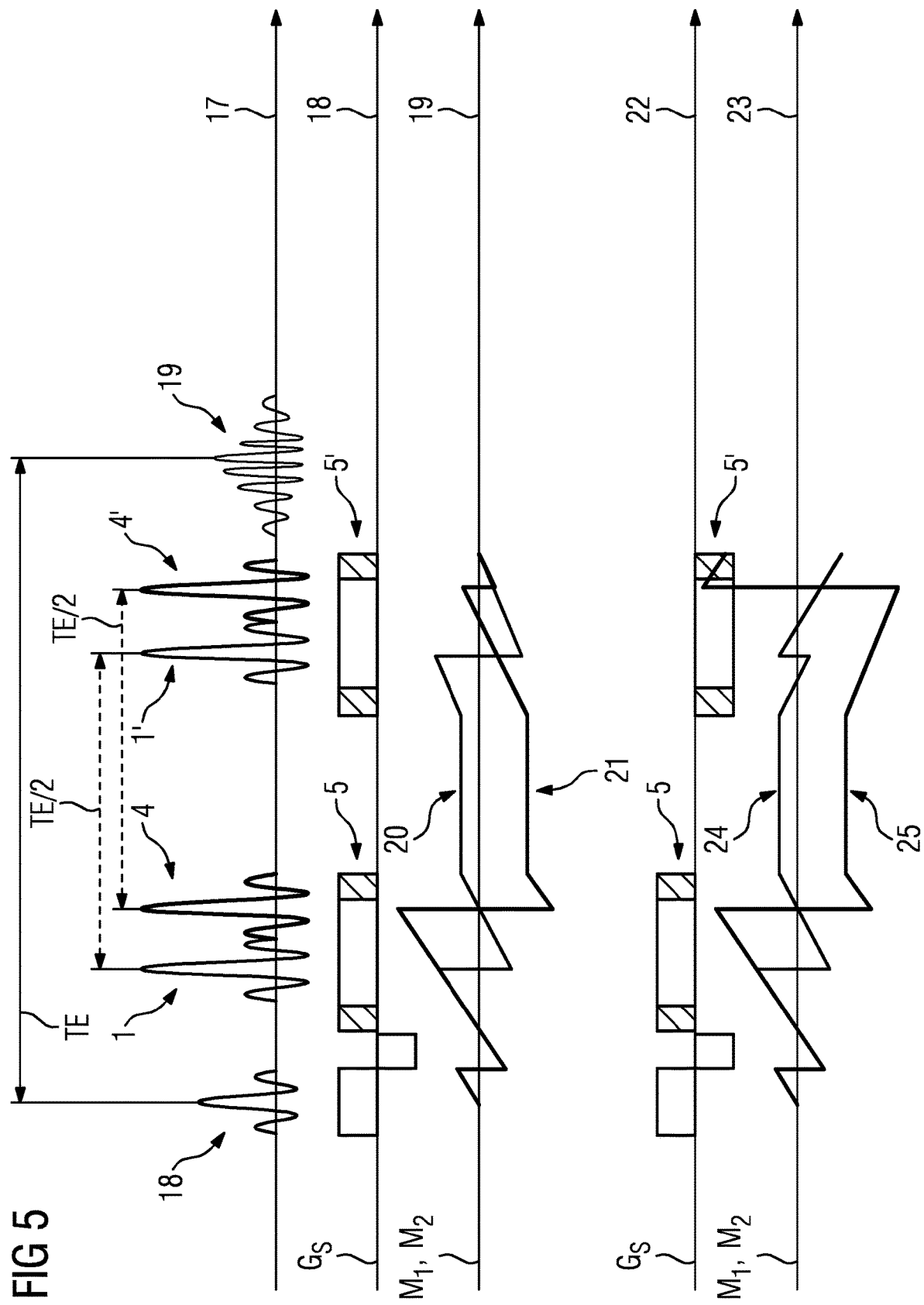
FIG. 5 illustrates the modification of slice-selection-gradient pulses in the case of a number of refocusing pulses.

The embodiment explained by FIG. 5 is based on the knowledge that the spin-echo condition with an echo time TE is satisfied precisely when the temporal spacing between the two radio-frequency pulses of a slice, according to FIG. 5 between the radio-frequency pulses 1, 1' and the radio-frequency pulses 4, 4', here refocusing pulses, is TE/2, as is also depicted in FIG. 5. However, this means that the radio-frequency pulses 1, 1', 4, 4' can be shifted within certain limits without the influence of T2* or T2 relaxation on the contrast changing. However, the shift alone does not enable the generation of a slice-specific correction-gradient moment, as also explained by the upper region of FIG. 5. While, in addition to the radio-frequency pulses 1, 1', 4, 4', for purposes of illustration, the time bar 17 also shows the excitation pulses 18 and the resulting magnetic resonance signal 19, which define the echo time TE. The time bar 18 shows the slice-selection-gradient pulses 5, 5', and the time bar 19 shows the resulting evolution of the magnetization in the form of lines 20, 21. It is evident from the constellation depicted by the time bars 17 and 18 that the correction-gradient moment for the two slices (lines 20 and 21) with the first radio-frequency pulse 1, 4 (refocusing pulse) are undone again with the following radio-frequency pulses 1', 4'. To achieve a slice-specific correction-gradient moment different from zero, it is necessary, in the second slice-selection time period 3, for the offsets of the radio-frequency pulses 1', 4' assigned to the two slices to be applied in the opposite direction, although in this case the spin-echo condition would no longer be met for at least one slice at the echo time TE, which would result in a discrepant T2* contrast.

Therefore, in a version of the method according to the invention, as depicted in the lower part along of the time beam 22, the slice-selection-gradient pulse 5, 5' are applied with the same amplitude, but different polarity for the two slice-selection time periods in which the refocusing pulses 1, 1', 4, 4' are applied. Hence, as the lines 24 and 25 along the time beam 23 show, a correction-gradient moment different from zero remains. While, generally speaking, this effect is possible with slice-selection-gradient pulses 5, 5' with a different amplitude and/or polarity, in the particularly advantageous case depicted here, when the same amplitude is used with an inverted polarity, the correction-gradient sub-moments generated are added together.

All three of the measures described herein are preferably used in combination in exemplary embodiments of the method according to the invention.

In this context, it should be noted that, when the maximum duration of the slice-selection time period is limited due to requirements so that the desired correction-gradient moments cannot be achieved for all simultaneously excited slices, at least the maximum possible correction-gradient moment is applied. Preferably, when using the second measure, a selection can be made as to which one of the slices for which the complete correction-gradient moment is applied. To this end, in the embodiment according to FIG. 4, it is possible, instead of the arithmetical mean values, to select a dedicated additional gradient moment, which is applied in the additional gradient pulse. For at least one of the slices, it thus can be ensured by a suitable selection that the necessary offset fits in the edge region 7, 8. For example, it is possible to ensure that in each case the slices closest to the center of the examination region, which are most important for the diagnosis, achieve the complete slice-specific correction phase.

Furthermore, it should be noted that the generation of the desired correction-gradient moment can be divided between the different radio-frequency pulses in any way desired so that, for example, the correction-gradient moment can be distributed in equal parts to all radio-frequency pulses (excitation and refocusing pulses). In accordance with the invention, it is also possible to take account of the described factor F. To this end, the maximum shift region for individual slice-selection time periods 3 is reduced.

Finally, FIG. 6 is a schematic illustration of a magnetic resonance apparatus 26 according to the invention. As in known in principle, this has a scanner 27 with a basic field magnet in which a patient receiving area 28 is defined, into which the patient can be introduced by a patient support (not shown). The patient can be surrounded, for example, by a radio-frequency coil arrangement and a gradient-coil arrangement. The operation of the magnetic resonance apparatus 26 is controlled by a control computer 29, which is also designed to implement the method according to the invention. Therefore, the control computer 29 can have a sequence control unit designed for the modification of a magnetic-resonance frequency of the simultaneous multislice imaging that is to be played out using the measures described here such that the slice-selection time period 3 is shortened and ideally also contrast differences of the slices are minimized or eliminated.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method to correct a signal phase in an acquisition of magnetic resonance (MR) signals from a subject by slice multiplexing, said method comprising:

operating an MR data acquisition scanner, while a subject is situated therein, in order to execute a simultaneous multi-slice (SMS) MR data acquisition sequence in which MR signals from multiple slices of the subject are detected simultaneously, and including, in said SMS MR data acquisition sequence, activating, in a slice selection direction, a slice selection gradient pulse that defines a slice selection time period and, for each respective slice of said multiple slices, radiating a radio-frequency (RF) pulse having a slice-specific frequency for the respective slice, thereby radiating multiple RF pulses that respectively produce a magnetization in each slice, with respective RF pulses among said multiple RF pulses at least partially overlapping, the respective MR signals of the respective slices each having a phase and the respective phases needing correction;

in a computer, determining a linear slice-specific correction phase to be applied to each of said multiple slices;

in said computer, for each respective RF pulse, determining, from said slice-specific correction phase and from properties of said slice-selection gradient pulse, a temporal offset of the respective RF pulse relative to a middle point in time of said slice selection time period;

operating said MR data acquisition scanner in order to radiate said multiple RF pulses respectively with the time offset calculated therefor, and in order to apply said correction phase for at least one data selection time period so as to apply, in each respective slice, a slice-specific correction gradient moment that acts on the magnetization of the respective slice so as to contribute to said correction phase for the respective slice; and operating said MR data acquisition scanner in order to shorten a time required for applying said slice-specific correction gradient moment by at least one of:

(a) in at least one edge region of edge regions symmetrically added to each of a beginning and an end of the slice selection time period for a respective slice, activating said slice selection gradient pulse with a higher amplitude than and with a same polarity as said slice selection gradient pulse has at said middle point in time, said slice selection gradient pulse thereby having a gradient amplitude curve, and adjusting the respective RF pulse radiated during said slice-selection time period dependent on said gradient amplitude curve and a predetermined slice profile of the respective slice, and (b) applying said slice-specific correction gradient moment to a respective slice by activating an additional gradient pulse in the slice selection direction that has a same polarity as the slice selection gradient during the slice selection time period and that acts on all of said multiple slices, thereby allowing the respective temporal offsets of the respective RF pulses to occur in a slice selection time period that is shorter than without activation of said additional gradient pulse.

2. A method as claimed in claim 1 comprising, for each slice selection time period in which an RF pulse is radiated with a respective temporal offset, operating the MR data acquisition unit to fix a duration of the slice selection time period dependent on a maximum temporal offset among all of the respective temporal offsets determined for the respective RF pulses.

3. A method as claimed in claim 1 comprising operating said MR data acquisition scanner to execute at least (a), and continuing said higher amplitude of said slice selection gradient pulse into a region of said slice selection time period in which said RF pulses do not overlap.

4. A method as claimed in claim 1 comprising operating said MR data acquisition scanner to implement at least (a), with said higher amplitude of said slice selection gradient pulse continuing from said at least one edge region into said selection time period with a ramped amplitude proceeding from said at least one edge region toward said middle point in time.

5. A method as claimed in claim 1 comprising, in said processor, determining a mean value of correction gradient moments for respective temporal offsets based on an absence of said additional gradient pulse, and formulating said additional gradient moment dependent on said mean value.

6. A method as claimed in claim 1 comprising, in (b) activating said additional gradient pulse jointly with a gradient pulse that produces said correction phase.

7. A method as claimed in claim 6 comprising activating said gradient pulse that produces said correction phase as a diffusion gradient pulse.

8. A method as claimed in claim 1 comprising operating said MR data acquisition unit to activate said slice selection gradient pulse, which has said higher amplitude in said at least one edge region than at said middle point in time, also for slice selection time periods in which no temporal offset of the respective RF pulse occurs.

9. A method as claimed in claim 1 comprising:
operating said MR data acquisition scanner to execute said SMS MR data acquisition sequence with a predetermined limit value that cannot be exceeded, said limit value being selected from the group consisting of a limit value for a repetition time of said SMS MR data acquisition sequence, and a limit value for an echo shift between echoes from respective slices that occur in said SMS MR data acquisition sequence and during which said MR data are acquired, said limit value preventing a correction phase for all of said multiple slices being achievable; and
applying said correction phase in order to apply a maximum slice-specific correction gradient moment that is achievable given said limit value.

10. A method as claimed in claim 1 comprising:
operating said MR data acquisition scanner to execute said SMS MR data acquisition sequence with a predetermined limit value that cannot be exceeded, said limit value being selected from the group consisting of a limit value for a repetition time of said SMS MR data acquisition sequence, and a limit value for an echo shift between echoes from respective slices that occur in said SMS MR data acquisition sequence and during which said MR data are acquired, said limit value preventing a correction phase for all of said multiple slices being achievable; and
in said processor, determining said correction phase in order to apply said slice specific correction gradient moment defined as a slice-specific correction gradient moment for at least one slice for which said correction phase can still be achieved with said limit value.

11. A method as claimed in claim 10 comprising selecting said at least one slice situated in a center of an acquisition of the subject from which said MR data are acquired.

12. A method as claimed in claim 10 comprising selecting said at least one slice as a slice situated within a diagnostically relevant region of the subject, from which said MR data are acquired.

13. A method as claimed in claim 1 comprising operating said MR data acquisition scanner in order to distribute said slice-selective gradient correction moment over a plurality of slice-selection time periods.

14. A method as claimed in claim 13 comprising distributing said slice-selective correction gradient moment over said plurality of slice-selection time periods with identical respective temporal offsets.

15. A method as claimed in claim 13 comprising, in said processor, determining said distribution of said slice-selective correction gradient moment over said plurality of slice-selection time periods by executing an optimization algorithm that minimizes a duration of slice-selection time periods in which respective temporal offsets are applied.

16. A method as claimed in claim 1 comprising operating said MR data acquisition scanner wherein said SMS MR data acquisition sequence comprises successive slice selection time periods in a first of which said RF pulse is radiated as an excitation pulse and in a second of which at least two refocusing pulses are radiated as RF pulses with no temporal offsets, with said slice selection gradient pulse being activated in said second of said successive slice-selection time periods with an opposite sign or with a different gradient amplitude from the slice-selection gradient pulse activated in the first of said successive slice-selection time periods, and, in said computer, determining said temporal offsets dependent on said respective signs and gradient amplitudes of the respective slice selection gradient pulses activated during said first and second of said successive slice-selection time periods.

17. A method as claimed in claim 16 comprising, in said computer, making all of the temporal offsets for all slice-selection time periods, in which said temporal offsets are applied, to be identical.

18. A magnetic resonance (MR) apparatus comprising:
an MR data acquisition scanner;
a computer configured to operate an MR data acquisition scanner, while a subject is situated therein, in order to execute a simultaneous multi-slice (SMS) MR data acquisition sequence in which MR signals from multiple slices of the subject are detected simultaneously, by including, in said SMS MR data acquisition sequence, activation, in a slice selection direction, of a slice selection gradient pulse that defines a slice selection time period and, for each respective slice of said multiple slices, radiation of a radio-frequency (RF) pulse having a slice-specific frequency for the respective slice, thereby radiating multiple RF pulses that respectively produce a magnetization in each slice, with respective RF pulses among said multiple RF pulses at least partially overlapping, the respective MR signals of the respective slices each having a phase and the respective phases needing correction;
said computer being configured to determine a linear slice-specific correction phase to be applied to each of said multiple slices; said computer being configured, for each respective RF pulse, to determine, from said slice-specific correction phase and from properties of said slice-selection gradient pulse, a temporal offset of the respective RF pulse relative to a middle point in time of said slice selection time period;
said computer being configured to operate said MR data acquisition scanner in order to radiate said multiple RF pulses respectively with the time offset calculated therefor, and in order to apply said correction phase for at least one data selection time period so as to apply, in each respective slice, a slice-specific correction gradient moment that acts on the magnetization of the respective slice so as to contribute to said correction phase for the respective slice; and
said computer being configured to operate said MR data acquisition scanner in order to shorten a time required for applying said slice-specific correction gradient moment by at least one of:
(a) in at least one edge region of edge regions symmetrically added to each of a beginning and an end of the slice selection time period for a respective slice, activating said slice selection gradient pulse with a higher amplitude than and with a same polarity as said slice selection gradient pulse has at said middle point in time, said slice selection gradient pulse thereby having a gradient amplitude curve, and adjusting the respective RF pulse radiated during said slice-selection time period dependent on said gradient amplitude curve and a predetermined slice profile of the respective slice, and (b) applying said slice-specific correction gradient moment to a respective slice by activating an additional gradient pulse in the slice selection direction that has a same polarity as the slice selection gradient during the slice selection time period and that acts on all of said multiple slices, thereby allowing the respective temporal offsets of the respective RF pulses to occur in a slice selection time period that is shorter than without activation of said additional gradient pulse.

19. A non-transitory, computer-readable data storage medium encoded with programming instructions, said storage medium being loaded into a computer of a magnetic resonance (MR) apparatus that comprises an MR data acquisition scanner, said programming instructions causing said computer to:

operate said MR data acquisition scanner, while a subject is situated therein, in order to execute a simultaneous multi-slice (SMS) MR data acquisition sequence in which MR signals from multiple slices of the subject are detected simultaneously, by including, in said SMS MR data acquisition sequence, activation, in a slice selection direction, of a slice selection gradient pulse that defines a slice selection time period and, for each respective slice of said multiple slices, radiation of a radio-frequency (RF) pulse having a slice-specific frequency for the respective slice, thereby radiating multiple RF pulses that respectively produce a magnetization in each slice, with respective RF pulses among said multiple RF pulses at least partially overlapping, the respective MR signals of the respective slices each having a phase and the respective phases needing correction;

determine a linear slice-specific correction phase to be applied to each of said multiple slices;

for each respective RF pulse, determine, from said slice-specific correction phase and from properties of said slice-selection gradient pulse, a temporal offset of the respective RF pulse relative to a middle point in time of said slice selection time period;

operate said MR data acquisition scanner in order to radiate said multiple RF pulses respectively with the time offset calculated therefor, and in order to apply said correction phase for at least one data selection time period so as to apply, in each respective slice, a slice-specific correction gradient moment that acts on the magnetization of the respective slice so as to contribute to said correction phase for the respective slice; and operate said MR data acquisition scanner in order to shorten a time required for applying said slice-specific correction gradient moment by at least one of:

(a) in at least one edge region of edge regions symmetrically added to each of a beginning and an end of the slice selection time period for a respective slice, activating said slice selection gradient pulse with a higher amplitude than and with a same polarity as said slice selection gradient pulse has at said middle point in time, said slice selection gradient pulse thereby having a gradient amplitude curve, and adjusting the respective RF pulse radiated during said slice-selection time period dependent on said gradient amplitude curve and a predetermined slice profile of the respective slice, and (b) applying said slice-specific correction gradient moment to a respective slice by activating an additional gradient pulse in the slice selection direction that has a same polarity as the slice selection gradient during the slice selection time period and that acts on all of said multiple slices, thereby allowing the respective temporal offsets of the respective RF pulses to occur in a slice selection time period that is shorter than without activation of said additional gradient pulse.

20. A non-transitory, computer-readable data storage medium encoded with programming instructions as claimed in claim 19 wherein said programming instructions further cause said computer to operate said MR data acquisition scanner in order to shorten a time required for applying said slice-specific correction gradient moment by also applying said slice-specific correction gradient moment to a respective slice by activating an additional gradient pulse in the slice selection direction that acts on all of said multiple slices, thereby allowing the respective temporal offsets of the respective RF pulses to occur in a slice selection time period that is shorter than without activation of said additional gradient pulse.

21. A method as claimed in claim 1 comprising operating said MR data acquisition scanner in order to shorten a time required for applying said slice-specific correction gradient moment by also applying said slice-specific correction gradient moment to a respective slice by activating an additional gradient pulse in the slice selection direction that acts on all of said multiple slices, thereby allowing the respective temporal offsets of the respective RF pulses to occur in a slice selection time period that is shorter than without activation of said additional gradient pulse.

22. An MR apparatus as claimed in claim 18 wherein said computer is configured to operate said MR data acquisition scanner in order to shorten a time period for applying said slice-specific correction gradient moment by also applying said slice-specific correction gradient moment to a respective slice by activating an additional gradient pulse in the slice selection direction that acts on all of said multiple slices, thereby allowing the respective temporal offsets of the respective RF pulses to occur in a slice selection time period that is shorter than without activation of said additional gradient pulse.

* * * * *